United States Patent
Lee et al.

(10) Patent No.: US 11,126,273 B2
(45) Date of Patent: Sep. 21, 2021

(54) USER INPUT DEVICES AND METHODS FOR IDENTIFYING A USER INPUT IN A USER INPUT DEVICE

(71) Applicant: RAZER (ASIA-PACIFIC) PTE. LTD., Singapore (SG)

(72) Inventors: Kah Yong Lee, Singapore (SG); Jian Yao Lien, Singapore (SG)

(73) Assignee: RAZER (ASIA-PACIFIC) PTE. LTD., Singapore (SG)

( * ) Notice: Subject to any disclaimer, the term of this patent is extended or adjusted under 35 U.S.C. 154(b) by 0 days.

(21) Appl. No.: 16/757,689

(22) PCT Filed: Oct. 20, 2017

(86) PCT No.: PCT/SG2017/050524
§ 371 (c)(1),
(2) Date: Apr. 20, 2020

(87) PCT Pub. No.: WO2019/078782
PCT Pub. Date: Apr. 25, 2019

(65) Prior Publication Data
US 2020/0249768 A1 Aug. 6, 2020

(51) Int. Cl.
*G06F 3/023* (2006.01)
*G06F 3/038* (2013.01)
*H03K 17/965* (2006.01)

(52) U.S. Cl.
CPC ............ *G06F 3/0234* (2013.01); *G06F 3/038* (2013.01); *H03K 17/965* (2013.01); *H03K 2217/9658* (2013.01)

(58) Field of Classification Search
CPC ..... G06F 3/0234; G06F 3/038; H03K 17/965; H03K 2217/9658; H03K 5/1254
See application file for complete search history.

(56) References Cited

U.S. PATENT DOCUMENTS 4,926,072 A * 5/1990 Hyodo ................. H03K 5/1252
326/26
7,535,131 B1 * 5/2009 Safieh, Jr. ............ H03K 5/1254
307/134
(Continued)

FOREIGN PATENT DOCUMENTS

DE         214030 B1       12/1986
JP      05-197467 A         8/1993
WO   WO 2017/117613 A2     7/2017

OTHER PUBLICATIONS

International Search Report and Written Opinion, dated Sep. 27, 2018, for the corresponding International Application No. PCT/SG2017/050524 in 14 pages.

(Continued)

*Primary Examiner* — Alexander Eisen
*Assistant Examiner* — Kebede T Teshome
(74) *Attorney, Agent, or Firm* — Polsinelli PC

(57) ABSTRACT

According to various embodiments, there is provided a method for identifying a user input in a user input device, the method including: detecting edges in an output signal generated by a switch in the user input device; identifying a first-to-second-state edge as being indicative of a transition from a first state to a second state; counting down to a first rest period upon identifying the first-to-second-state edge; before completion of the counting down to the first rest period, restarting the counting down upon each detection of a further edge in the output signal; detecting a second-to-first-state edge in the output signal that occurs after completion of the counting down to the first rest period; and identifying the second-to-first-state edge as being indicative of a transition from the second state to the first state.

16 Claims, 10 Drawing Sheets

(56) References Cited

U.S. PATENT DOCUMENTS

| | | |
|---|---|---|
| 8,542,196 B2 | 9/2013 | Pallakoff |
| 8,599,169 B2 | 12/2013 | Nascimento |
| 8,723,833 B2 | 5/2014 | Curtis et al. |
| 8,766,944 B2 | 7/2014 | Ksondzyk |
| 8,957,854 B2 | 2/2015 | Coe |
| 9,058,078 B2 | 6/2015 | Weaver et al. |
| 9,229,576 B2 | 1/2016 | Ng et al. |
| 2002/0154038 A1 | 10/2002 | Houston |
| 2006/0076984 A1* | 4/2006 | Lu ................ H03K 5/1254 327/34 |
| 2009/0135030 A1 | 5/2009 | Ron et al. |
| 2010/0321301 A1 | 12/2010 | Casparian et al. |
| 2013/0127517 A1 | 5/2013 | Chen |
| 2016/0087615 A1* | 3/2016 | Todd ................ H03K 5/1254 327/386 |
| 2016/0117048 A1 | 4/2016 | Frame |

OTHER PUBLICATIONS

Extended European Search Report dated Oct. 13, 2020, 10 pages, for the corresponding European Patent Application No. 17929157.0.

\* cited by examiner

USER INPUT DEVICES AND METHODS FOR IDENTIFYING A USER INPUT IN A USER INPUT DEVICE

TECHNICAL FIELD

Various embodiments relate to user input devices and methods for identifying a user input in a user input device.

BACKGROUND

Input devices, such as keyboards and computer mice typically include input buttons such as clickable keys or depressible buttons. These input buttons may be coupled to switches such that actuation of these input buttons may cause the switches to change a connection status of a circuit, in other words, to open a closed circuit or to close an open circuit. The switches typically include moving parts such as electrical contacts which physically move from one position to another, to change the connection status of the circuit. While the act of actuating an input button may appear to be instantaneous to a user, within the short instant of actuating and releasing the input button, the moving parts of the switch may vacillate between the position to close the circuit and the position to open the circuit multiple times. This effect may be commonly referred to as switch bouncing. The vacillation of the moving parts may generate electrical signals that can be misinterpreted by the input device as operation signals. These false signals may be referred to as bounce signals.

SUMMARY

According to various embodiments, there may be provided a method for identifying a user input in a user input device, the method including: detecting edges in an output signal generated by a switch in the user input device; identifying a first-to-second-state edge as being indicative of a transition from a first state to a second state; counting down to a first rest period upon identifying the first-to-second-state edge; before completion of the counting down to the first rest period, restarting the counting down upon each detection of a further edge in the output signal; detecting a second-to-first-state edge in the output signal that occurs after completion of the counting down to the first rest period; and identifying the second-to-first-state edge as being indicative of a transition from the second state to the first state.

According to various embodiments, there may be provided a user input device including: a switch configured to generate an output signal upon being operated; an edge detector configured to detect edges in the output signal; a transition identifier configured to identify a first-to-second-state edge as being indicative of a transition from a first state to a second state; a timer configured to count down to a first rest period upon the transition identifier identifying the first-to-second-state edge, and further configured to restart the counting down every time the edge detector detects a further edge in the output signal before the timer completes the counting down to the first rest period; wherein the transition identifier is further configured to identify a second-to-first-state edge in the output signal that occurs after completion of the counting down to the first rest period, as being indicative of a transition from the second state to the first state.

According to various embodiments, there may be provided a non-transitory computer-readable medium including instructions which, when executed by a processor, causes the processor to perform a method for identifying a user input in a user input device, the method including: detecting edges in an output signal generated by a switch in the user input device; identifying a first-to-second-state edge as being indicative of a transition from a first state to a second state; counting down to a first rest period upon identifying the first-to-second-state edge; before completion of the counting down to the first rest period, restarting the counting down upon each detection of a further edge in the output signal; detecting a second-to-first-state edge in the output signal that occurs after completion of the counting down to the first rest period; and identifying the second-to-first-state edge as being indicative of a transition from the second state to the first state.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1:
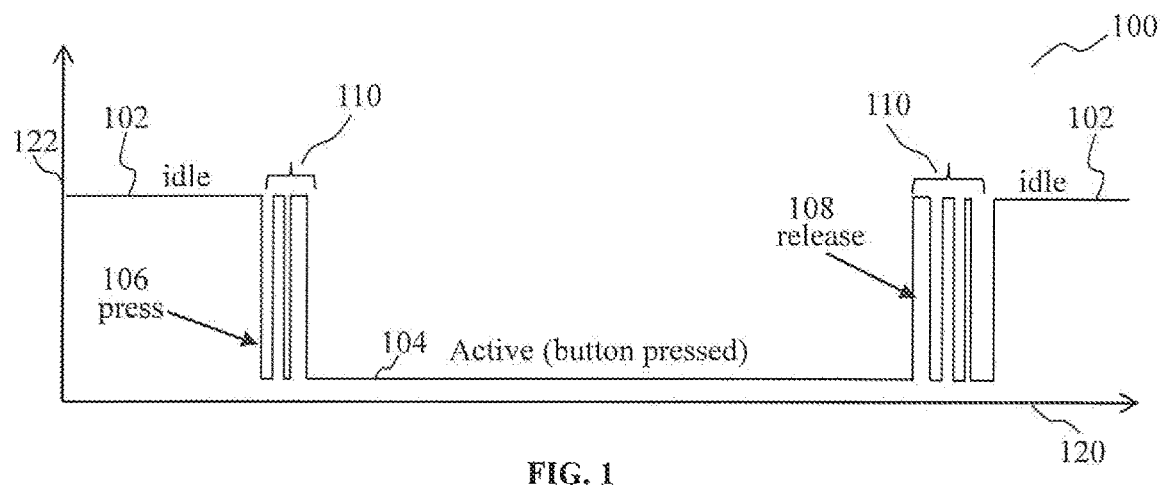
FIG. 1 shows a signal diagram of a typical button click signal.

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

In this context, the user input device as described in this description may include a memory which is for example used in the processing carried out in the user input device. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

In the specification the term "comprising" shall be understood to have a broad meaning similar to the term "including" and will be understood to imply the inclusion of a stated integer or step or group of integers or steps but not the exclusion of any other integer or step or group of integers or steps. This definition also applies to variations on the term "comprising" such as "comprise" and "comprises".

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

The reference to any conventional devices in this specification is not, and should not be taken as an acknowledgement or any form of suggestion that the referenced conventional devices form part of the common general knowledge in Australia (or any other country).

In order that the invention may be readily understood and put into practical effect, various embodiments will now be described by way of examples and not limitations, and with reference to the figures.

In the context of various embodiments, the phrase "button click signal" may be but is not limited to being interchangeably referred to as an "output signal generated by a switch" or simply "output signal".

Any user input device that includes a switch may be susceptible to the effect of switch bouncing, which may cause the user input device to register phantom clicks, for example, to register a double click, in other words a "phantom" second click, when the user only clicks the button for operating the switch once. Methods to counter the bouncing effect, also referred to as methods of debouncing, may include masking out signals that occur right after a bona fide click, or release of the button, using a fixed duration mask. The concept of bouncing will be explained with the aid of FIGS. 1 to 3.

According to various embodiments, a method of debouncing, in other words, detecting a user input while ignoring bounce signals may include employing a dynamic masking period. The dynamic masking period may mask out quick and successive transition edges that occur in the output signal of a switch, while recognizing that transition edges that occur after a predetermined duration of non-activity are genuine user input signals. The principle of the method lies in that the bounce signals tend to occur in quicker succession as compared to the time that a human takes to release a button after depressing the button.

FIG. 1 shows a signal diagram 100 of a typical button click signal. The button click signal may be generated, when a button on a user input device is clicked. The act of clicking a button may include pressing the button and releasing the button. The button may be mechanically coupled to a switch such that the switch toggles between two states based on movements of the button. The switch may generate an output signal which is the button click signal shown in the signal diagram. The signal diagram 100 includes a horizontal axis 120 indicating time, and a vertical axis 122 indicating amplitude of the button click signal. When the button is not operated, the switch may be un-actuated and so, the button click signal may be in an idle state 102. High amplitude in the button click signal may be indicative of the idle state 102. When the button is pressed, the switch may be actuated by the button, causing the button click signal to transit to an active state 104. Low amplitude in the button click signal may indicate the active state 104. A first-to-second-state edge 106 may indicate the transition from the idle state 102 to the active state 104. When the button is released, the switch may be un-actuated again, causing the button click signal to return to the idle state 102. A second-to-first-state edge 108 may indicate the transition from the active state 104 to the idle state 102. The transition from the idle state 102 to the active state 104, as well as the transition from the active state 104 to the idle state 102 may not be instantaneous. In between the two states, the button click signal may fluctuate, and result in bounce signals 110. The user input device may interpret the transition edges in the bounce signals 110 as each being a change in state, and thus, toggle the state between the idle state 102 and the active state 104 according to the bounce signals 110. The input device may convey to a computing device, that the button is being clicked multiple times, i.e. transmit multiple false user inputs to the computing device. The computing device may translate the false user inputs into actions or processes in applications that are being run on the computing device.

Figure 2:
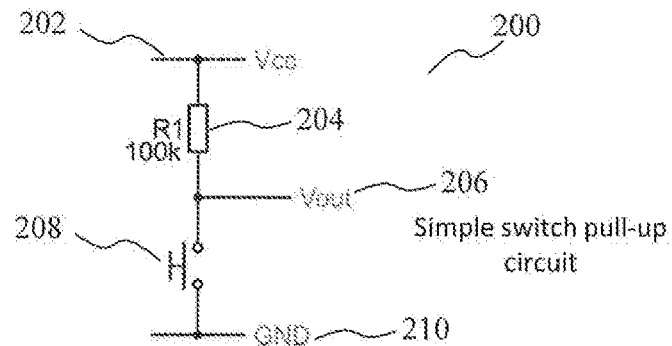
FIG. 2 shows a schematic diagram of an example of a switch circuit in a user input device.

FIG. 2 shows a schematic diagram 200 of an example of a switch circuit in a user input device. The switch circuit may be the generator of the output signal or button click signal shown in FIG. 1. The switch circuit shown is a switch pull-up circuit. The switch circuit may include a supply line 202, a resistive load 204, an output line 206, a switch 208 and a ground line 210. The resistive load 204 may be connected between the supply line 202 and the output line 206. The switch 208 may be connected between the ground line 210 and the output line 206. The button click signal referred to above, may be the voltage at the output line 206. When the switch 208 is open, the voltage at the output line 206 is the voltage of the supply line 202 less the voltage drop across the resistive load 204. This voltage value may indicate a logical high. When the switch 208 is closed, the output line 206 is connected to the ground line 210, and hence, the voltage at the output line 206 drops to zero. The zero voltage value may indicate a logical low. The logical high and the logical low may each represent a different state of the switch circuit, or of the user input device.

Figure 3:
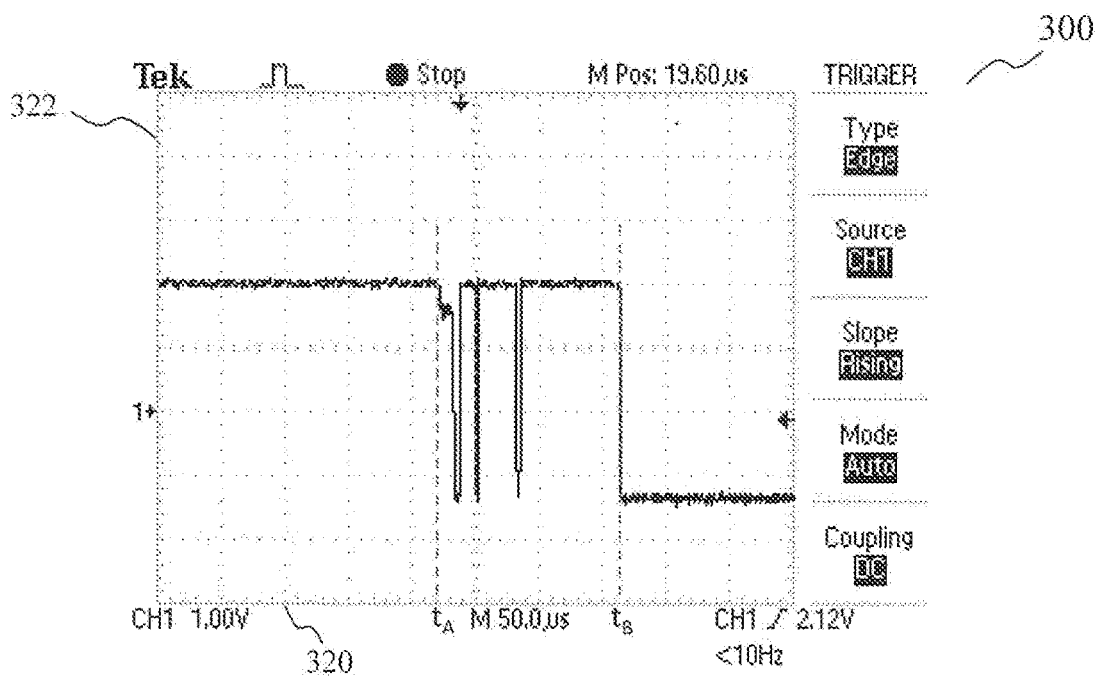
FIG. 3 shows a signal diagram of the voltage at the output line of the switch circuit of FIG. 2.

FIG. 3 shows a signal diagram 300 of the voltage at the output line 206 of the switch circuit of FIG. 2, in other words, the button click signal. The signal diagram 300 includes a horizontal axis 320 indicating time, and a vertical axis 322 indicating voltage. At time $t_A$, the voltage level drops, and then rebounds, before dropping again and rebounding again. At time $t_B$, the voltage level finally drops without rebounding in the short term. The fluctuations in voltage level between $t_A$ and $t_B$ are bounce signals generated by the switch, after a user closes the switch at time $t_A$. The electrical contacts of the switch flip flop between the closed and open positions until the electrical contacts finally become stationary at $t_B$.

Figure 4A:
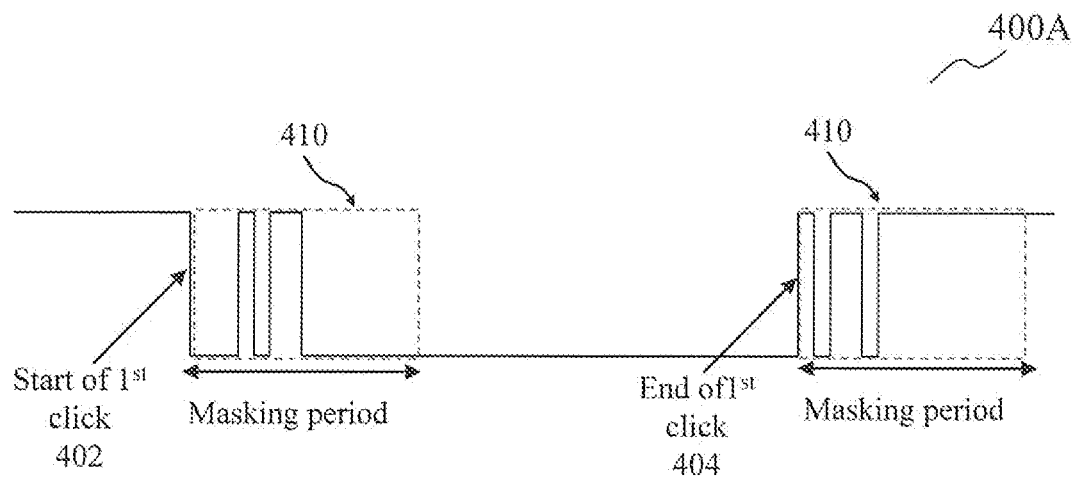
FIG. 4A shows a signal diagram illustrating a method of debouncing a normal button click signal using a known method.

FIG. 4A shows a signal diagram 400A illustrating a method of debouncing a normal button click signal using a known method. A user input device may generate the button click signal using a switch in the user input device. The switch may be mechanically coupled to a button such that the switch generates a transition edge in the button click signal when the button is operated, i.e. clicked or released. At the start of a click, in other words, when the button is clicked but not yet released, the button click signal may transit from a first state to a second state, in other words, exhibit a first-to-second-state edge 402. The first state may be an idle state. The second state may be an active state. In the example shown, the first state is a logical high and the second state is a logical low, such that the first-to-second-state edge 402 is a falling edge. A known method of debouncing the output signal may include ignoring all transition edges within a fixed masking period 410 upon detecting the first-to-second-state edge 402. The user input device may remove the transition edges within the masking period 410 from the output signal when transmitting the output signal to a computing device. Alternatively, the computing device may be configured to ignore or disregard the transition edges within the masking period 410. At the end of the click, in other words, when the button is released, the output signal rises, exhibiting a second-to-first-state edge 404. The second-to-first-state edge 404 may be indicative of a transit from the active state to the idle state. Once again, the masking period 410 may be applied to hide, ignore or remove the transition edges that occur after the second-to-first-state edge 404. As a result of applying the masking period 410, the bounce signals are obscured and hence, the button click is detected correctly. The user input device or the computing device may recognize the first-to-second-state edge 402 as indicating the start of the button click event and the second-to-first-state edge 404 as indicating the end of the button click event. However, while this known method may be sufficient for debouncing a standard button click signal, it may be a blunt tool that cannot adequately handle other scenarios. The inadequacies of this known method will be described in relation to FIGS. 4B-4D.

Figure 4B:
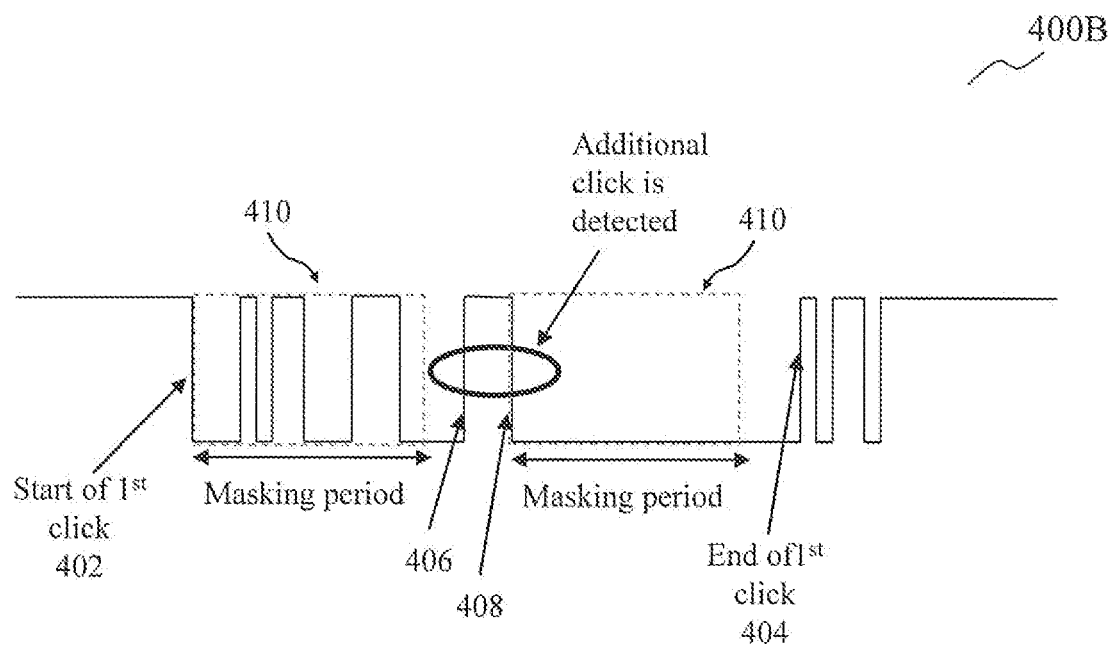
FIG. 4B shows a signal diagram illustrating a method of debouncing a button click signal that includes persistent bounce signals, using the known method described in relation to FIG. 4A.

FIG. 4B shows a signal diagram 400B illustrating a method of debouncing a button click signal that includes persistent bounce signals, using the known method described in relation to FIG. 4A. The button click signal of FIG. 4B may differ from the button click signal of FIG. 4A in that there are bounce signals over a longer period of time. At the start of a first click, the output signal of the switch falls as indicated by the first-to-second-state edge 402. The user input device or the computing device coupled to the user input device may obscure or ignore bounce signals that occur after the first-to-second-state edge 402, for a time duration equal to the masking period 410. However, the button click signal may include bounce signals that extend beyond the masking period 410. Therefore, not all of the bounce signals may be ignored. The user input device or the computing device may mistakenly interpret the bounce signal(s) that occur beyond the masking period 410 as an additional click(s). The user input device may wrongly identify the rising edge 406 as the end of the first click, and wrongly identify the falling edge 408 as the start of a second click.

Figure 4C:
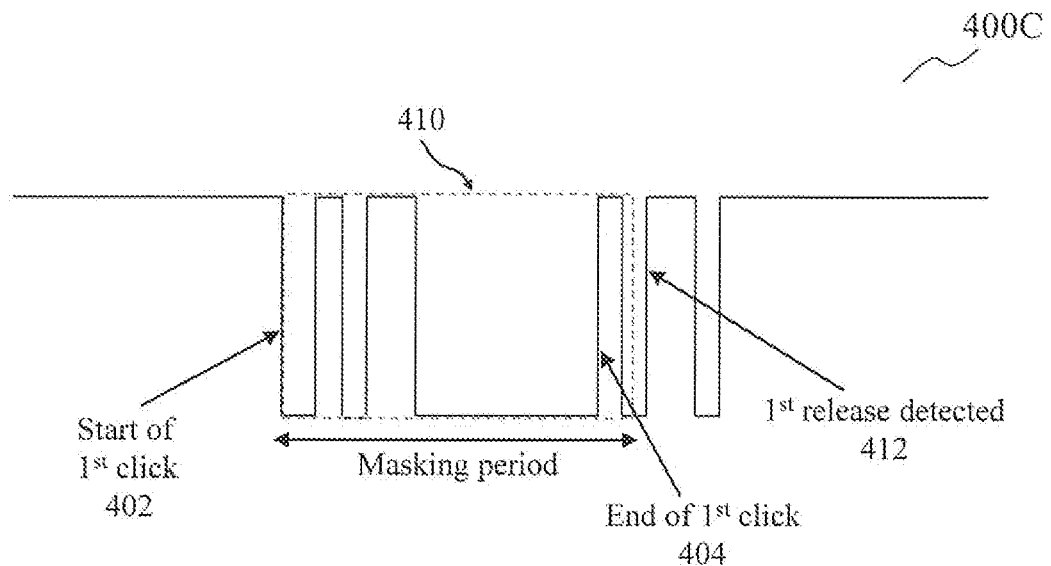
FIG. 4C shows a signal diagram illustrating a method of debouncing a button click signal where the click interval is short, using the known method described in relation to FIG. 4A.

FIG. 4C shows a signal diagram 400C illustrating a method of debouncing a button click signal where the click interval is short, using the known method described in relation to FIG. 4A. The button click signal of FIG. 4C may differ from the button click signal of FIG. 4A in that the click interval is shorter. In other words, the user releases the button earlier. This may occur if the user has a very quick response time. In this case, the end of the first click (in other words: the release of the button), as indicated by second-to-first-state edge 404, may occur before the end of the masking period 410. The user input device may ignore the second-to-first-state edge 404 as it falls within the masking period 410. As a result, the user input device does not detect the end of the first click. Instead, the user input device may identify a subsequent bounce signal 412, as the end of the first click. Thus, the detection of the button release may be delayed. Such a delay may be undesirable especially in a fast-paced application requiring quick responses from the user.

Figure 4D:
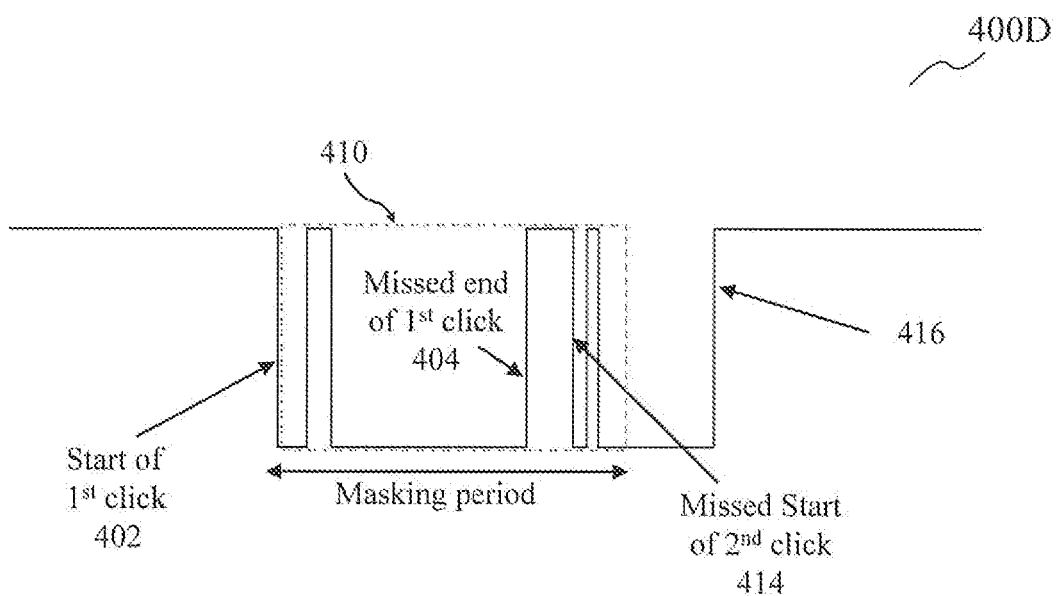
FIG. 4D shows a signal diagram illustrating a method of debouncing a button click signal that includes a double-click, using the known method described in relation to FIG. 4A.

FIG. 4D shows a signal diagram 400D illustrating a method of debouncing a button click signal that includes a double-click, using the known method described in relation to FIG. 4A. The button click signal may be generated when the button is clicked twice in quick succession. The button click signal of FIG. 4D may differ from the button click signals of FIGS. 4A to 4C in that it includes a second click. Like the button click signal of FIG. 4C, the click interval may be short. The second-to-first-state edge 404 indicating release of the button may take place earlier than the end of the masking period 410. As such, the user input device may miss the end of the first click as it is masked off together with bounce signals. Furthermore, the start of the second click indicated by a further first-to-second-state edge 414 may also be masked off by the masking period 410. As such, the user input device may interpret the end of the second click (a further second-to-first-state edge 416), as the end of the first click. In computing applications, double-clicks are often used to execute a different function from single-clicks, for example to open a file versus to select a file. Therefore, the misinterpretation of a double-click as a single-click would hinder the application from performing the user's desired action.

According to various embodiments, a method for identifying a user input in a user input device may include detecting button clicks using a dynamic masking period. The method may include applying a masking period that is substantially shorter than a human response time, and applying the masking period after every transition edge in the output signal of a switch in the user input device. The method may address the problems described in relation to FIGS. 4B-4D. The user input device may be any computer peripheral device that employs a user-actuable switch, for example, a computer mouse, a keyboard, a joystick or a game controller. The method for identifying the user input may be performable by the user input device, or a computing device in communication with the user input device.

Figure 5:
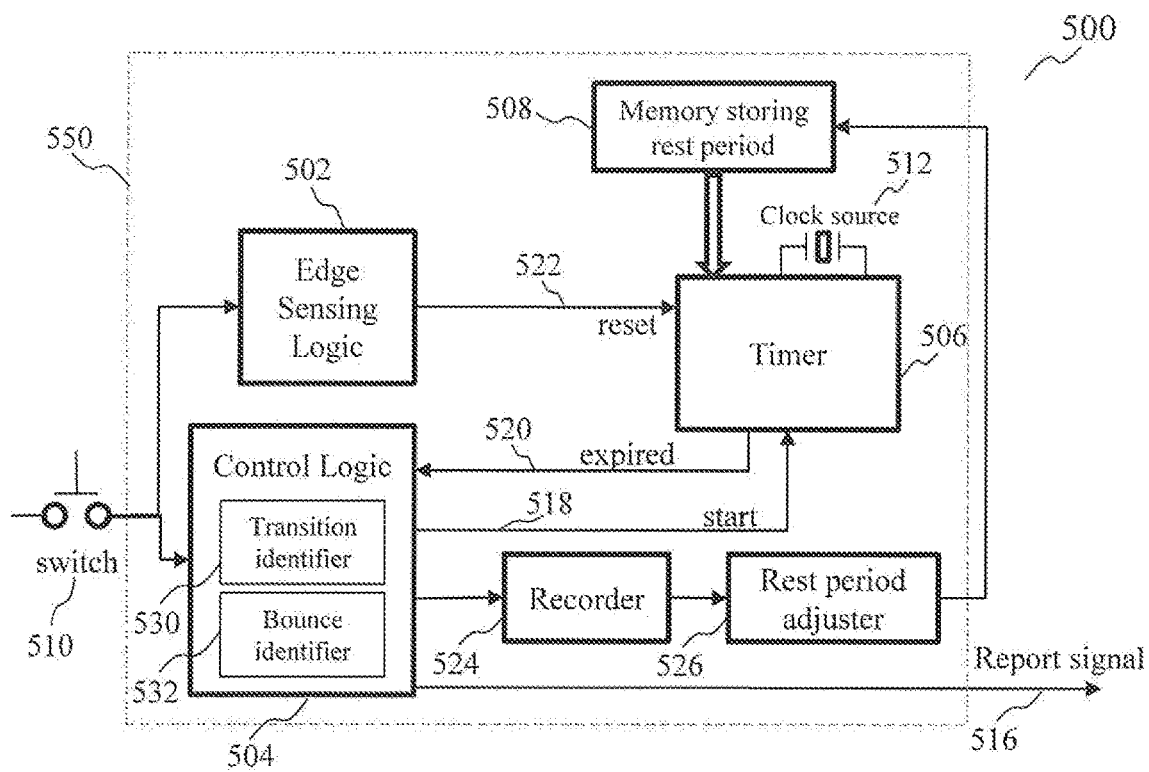
FIG. 5 shows a schematic diagram of a user input device according to various embodiments.

FIG. 5 shows a schematic diagram of a user input device 500 according to various embodiments. The user input device 500 may include a switch 510 configured to generate an output signal, and a user input detector 550 configured to detect a user input based on the output signal. The user input detector 550 may include an edge sensing logic 502, a timer 506 and a control logic 504. The edge sensing logic, also referred herein as an edge detector, may receive the output signal from the switch 510, and may be configured to detect edges in the output signal. The timer 506, also referred herein as count down timer, may be configured to count down to a rest period. The user input detector 550 may further include a memory 508 that stores information on the duration of the rest period. The timer 506 may read the rest period from the memory 508. The user input detector 550 may further include a clock source 512 that provides a reference clock signal to the timer 506. The clock source 512 may ensure the accuracy of the timer 506 by synchronizing the timer 506 to the reference clock signal. The control logic 504 may include a transition identifier 530. The transition identifier 530 may receive information about detected edges from the edge sensing logic 502, and may identify whether the detected edges are indicative of a transition from one state to another state.

When a button of the user input device 500 is pressed to activate the switch 510, the switch 510 may generate a first-to-second-state edge in its output signal. The edge sensing logic 502 may detect the first-to-second-state edge and report the detection to the control logic 504. The transition identifier 530 may recognize the first-to-second-state edge as an indication of a transition from the first state to the second state. In other words, the transition identifier 530 may recognize the start of a button click event. In response to the detection of the first-to-second-state edge, the control logic 504 may send a start signal 518 to the timer 506. The timer 506 may read the memory 508 to retrieve information on the rest period, and then may proceed to count down to the rest period. Meanwhile, the edge sensing logic 502 may continue to detect any other edges in the output signal of the switch 510. If there is a bounce signal, the edge sensing logic 502 may detect the edges of the bounce signal and may send a reset signal 522 to the timer 506. Upon receiving the reset signal 522, the timer 506 may reset the process of counting down. For every other subsequent edge detections before the timer 506 completes the counting down process, the edge sensing logic 502 may again send a reset signal 522 to reset the timer 506. When the timer 506 has completed the counting down, the timer 506 may send an expired signal 520 to the control logic 504. The transition identifier 530 may identify the subsequent detected edge as a second-to-first-state edge, in other words, the end of the button click event. This second-to-first-state edge may be the earliest edge that occurs in the output signal after completion of the counting down. The control logic 504 may then generate a report signal 516. The user input device 500 may transmit the report signal 516 to the computing device. The report signal may be indicative of a state of the user input device 500, in other words, whether the user input device 500 is in an idle state or an active state.

According to various embodiments, the control logic 504 may further include a bounce identifier 532. The bounce identifier 532 may receive information about detected edges from the edge sensing logic 502, and may identify whether the detected edges are part of bounce signals. The bounce identifier 532 may identify the bounce signals based on whether the detected edges occur less than the rest period after an immediately preceding edge in the output signal. The control logic 504 may ignore, or remove the identified bounce signals.

According to various embodiments, the user input detector 550 may further include a recorder 524 and a rest period adjuster 526. The recorder 524 may receive information on the identified bounce signals from the bounce identifier 532, and may record intervals between successive identified bounce signals. The rest period adjuster 526 may determine an optimum value for the rest period based on the recorded intervals. The rest period adjuster 526 may determine the optimum rest period based on the longest interval of the recorded intervals, for example by adding a predetermined buffer time to the longest interval. The determined optimum rest period may be just long enough to identify all bounce signals, but short enough not to misidentify a bona fide transition edge. The rest period adjuster 526 may write the determined optimum rest period to the memory 508. By dynamically adjusting the optimum rest period, the user input device 500 may ensure the accuracy of its report signal 516 even as the conditions of usage change which may affect the quantity and duration of the bounce signals. For example, the characteristics of the bounce signals may vary according to the user's response time and strength of clicking the button.

According to alternative embodiments, the user input detector 550 may be external to the user input device 500, and instead, may be part of a computing device. The computing device may for example, a personal computer, a video game console or a gaming machine. The user input detector 550 may be implemented as circuits in the computing device. The user input detector 550 may also be implemented as executable modules residing in a computer-readable medium.

Figure 6:
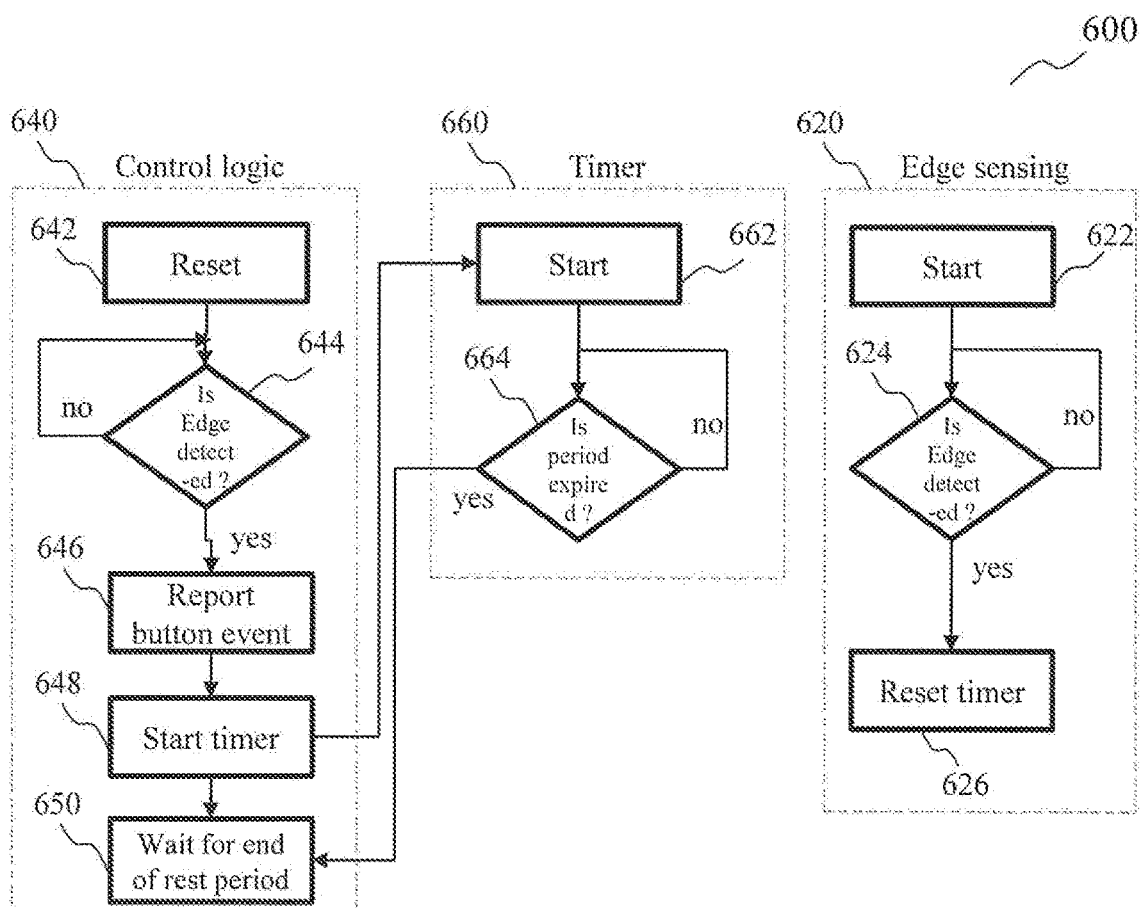
FIG. 6 shows a flow chart illustrating a method for detecting a user input in a user input device, according to various embodiments.

FIG. 6 shows a flow chart 600 illustrating a method for detecting a user input in a user input device, according to various embodiments. The flow chart 600 includes a first process flow 640 which may be performed by the control logic 504, a second process flow 660 which may be performed by the timer 506, and a third process flow 620 which may be performed by the edge sensing logic 502. The first process flow 640 may begin with 642. After 642, the first process flow 640 may proceed to 644, where the control logic 504 receives information from the edge sensing logic 502, on whether an edge is detected. If no edge is detected, the first process flow 640 returns to the 644 to wait for detection of edges by the edge sensing logic. If the edge detection logic 502 has detected an edge, the first process flow 640 proceeds to 646 where the control logic 504 reports a button event. The button event may be pressing of a button, or release of the button. In other words, the control logic 504 reports a change in the state of the user input device. The control logic 504 may report the button event via the report signal 516. After that, the first process flow 640 may proceed to 648, where the control logic 504 may trigger the timer 506 to start counting down, for example via the start signal 518. The timer 506 may count down to a predefined rest period. Next, the first process flow 640 may go to 650. In 650, the control logic 504 may look out for end of the counting down.

The second process flow 660 may begin with 662. Next, the second process flow 660 may proceed to 664 where the timer 506 may determine whether the predefined rest period 508 has expired. If the predefined rest period 508 has expired, in other words, the timer 506 has completed the process of counting down, the timer 506 may send an expired signal 520 to the control logic 504. If the predefined rest period has not yet expired, the count down timer 506 continues to count down till end of the predefined rest period.

The third process flow 620 may begin with 622. Next, the third process flow 620 may proceed to 624 where the edge sensing logic 502 detects edges in the output signal. If the edge sensing logic 502 detects an edge, the third process flow 620 may proceed to 626 where the edge sensing logic 502 sends a reset signal 522 to the timer 506. The process 626 may be identical to the process 662. If the edge sensing logic 502 does not detect an edge, the third process flow 620 may return to 624.

Figure 7:
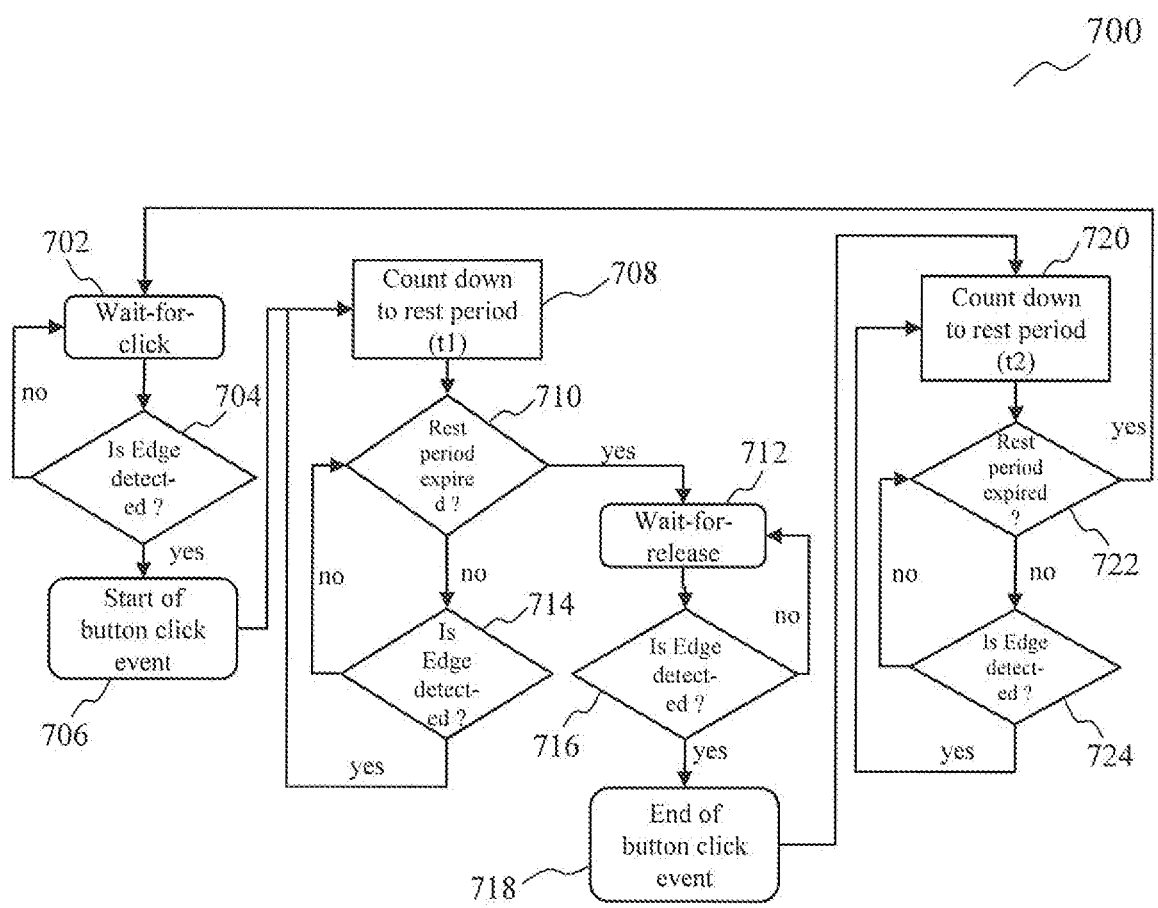
FIG. 7 shows a flow chart illustrating a method for detecting a user input in a user input device according to various embodiments.

FIG. 7 shows a flow chart 700 illustrating a method for detecting a user input in a user input device according to various embodiments. The flow chart 700 may include the first process flow 640, the second process flow 660, and the third process flow 620. The flow chart 700 shows the relationship between various processes performed by the entities of the user input detector 550.

The method may begin with 702, where the control logic 504 waits for a click event to start. At 702, the user input device is in an idle state. In 704, if the edge sensing logic 502 does not detect an edge, the method returns to 702. In 704, if the edge sensing logic 502 detects an edge, the method proceeds to 706. In 706, a transition identifier 530 in the control logic 502 identifies the start of a button click event. The transition identifier 530 may be able to identify the detected edge as being a first-to-second-state edge instead of merely a bounce signal, because the detected edge occurred when the control logic is in a process of waiting for a click event. The method may then proceed to 708, where the timer 506 may start to count down to a first rest period, $t_1$. The first rest period may be the predetermined rest period stored in the memory 508. In 710, the timer 506 may determine or report, whether the counting down to $t_1$ has been completed. If the timer 506 has completed counting down to $t_1$, the method may proceed to 712. If the timer 506 is still in the midst of counting down to $t_1$, the method may proceed to 714. In 714, the edge sensing logic 502 may determine whether an edge is detected while the timer 506 is still counting down. If in 714, the edge sensing logic 502 detects an edge in the output signal, the method may return to 708 to reset the timer 506 so that the timer 506 may restart the counting down to $t_1$. If in 714, no edge is detected, the method may return to 710. In 712, the control logic 504 may wait for release of the button which may be indicated by a second-to-first-state edge. Next, in 716, the edge sensing logic 502 may sense whether there are edges in the output signal occurring after the timer 506 has completed counting down. If in 716, the edge sensing logic 502 detects an edge, the method may proceed to 718, where the transition identifier 530 may identify the detected edge to be a transition edge indicating a return to the idle state, in other words, end of the button click event. The second-to-first-state edge may be the earliest edge that occurs in the output signal, after completion of the counting down to $t_1$. The method may then proceed to 720 where the timer 506 may count down to a second rest period, $t_2$. In 722, the timer 506 may indicate whether it has completed the counting down to $t_2$. If the timer 506 has completed the counting down to $t_2$, the method may return to 702 to wait for the next transition of state, i.e. a click event. If the timer 506 has not yet completed the counting down to $t_2$, in 724, the edge sensing logic 502 may be queried as to whether an edge is detected. If in 724, the edge sensing logic 502 has detected an edge before $t_2$ has lapsed, the method may return to 720 to reset the timer 506 to restart counting down to $t_2$. The advantages of applying this method will be shown in relation to FIGS. 8A to 8D.

According to various embodiments, $t_2$ may be different from $t_1$, for example $t_2$ may be shorter than $t_1$.

According to various embodiments, the second rest period $t_2$ may be the same as the first rest period $t_1$.

According to various embodiments, the rest period adjuster 526 may adjust at least one of $t_1$ or $t_2$ based on intervals between identified bounce signals as recorded by the recorder 524. The rest period adjuster 526 may adjust at least one of $t_1$ or $t_2$ based on a longest interval of the recorded intervals. The rest period adjuster 526 may adjust at least one of $t_1$ or $t_2$ to be slightly longer than the longest interval. The rest period adjuster 526 may continuously adjust at least one of $t_1$ or $t_2$ as the recorder 524 records more intervals between successive identified bounce signals, so that at least one of $t_1$ or $t_2$ may be of an at least substantially minimum time duration required to filter off the bounce signals.

According to various embodiments, $t_1$ and $t_2$ may be individually adjusted by the rest period adjuster 526, based on recorded intervals between identified bounce signals. The recorder 524 may separately record, the intervals between successive bounce signals immediately following a first-to-second-state edge as a first group of intervals, and the intervals between successive bounce signals immediately following a second-to-first-state edge as a second group of intervals. The rest period adjuster 526 may adjust $t_1$ based on the first group of intervals, for example a longest interval from the first group of intervals. The rest period adjuster 526 may adjust $t_2$ based on the second group of intervals, for example a longest interval from the second group of intervals. The rest period adjuster 526 may continuously, or periodically, update the values of $t_1$ and $t_2$ in the memory 508.

Figure 8A:
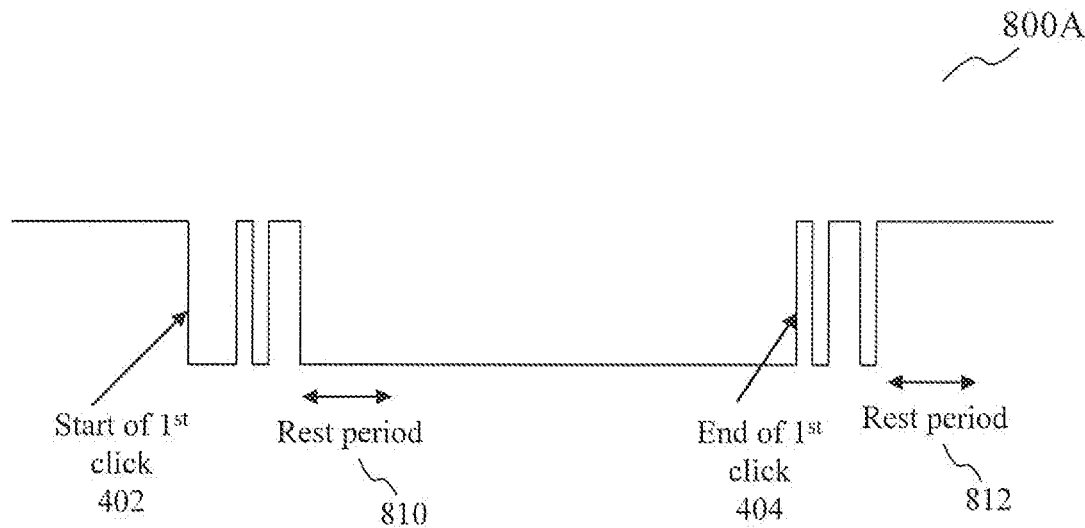
FIG. 8A shows a signal diagram illustrating a button click signal that includes normal bounce signals, debounced using the method of FIG. 7.

FIG. 8A shows a signal diagram 800A illustrating a button click signal that includes normal bounce signals, debounced using the method of FIG. 7. When the button click signal, in other words, the output signal of the switch 510 in the user input device 500 falls from a high voltage to a low voltage at first-to-second-state edge 402, the transition identifier 530 of the control logic 504 may recognize that the first-to-second-state edge 402 indicates a transition from a first state to a second state. In this case, the first state may be an idle state while the second state may be an active state. The first-to-second-state edge 402 may indicate start of a button click event. The timer 506 may begin to count down to a rest period 810. If the edge sensing logic 502 detects another edge in the output signal before the rest period 810 has lapsed, the edge sensing logic 502 may reset the timer 506. The timer 506 may then restart the counting down to the rest period 810, until the rest period 810 has lapsed without the edge sensing logic 502 detecting any further edges in the output signal. After the timer 506 has completed the counting down, the control logic 504 may proceed towards the "wait-for-release" process 712 as shown in FIG. 7. Next, the transition identifier 530 may identify the next edge detected by the edge sensing logic 502 as being indicative of a transition from the active state to the idle state. In other words, the second-to-first-state edge 404 may indicate the end of the button click event, where the user releases the button. Similarly to the identification of the first-to-secondstate edge 402, the timer 506 may count down to the rest period 812. The timer 506 may restart the counting down to the rest period 812, if the edge sensing logic 502 detects further edges in the output signal before the rest period 812 has lapsed. After the timer 506 has completed the counting down, the control logic may proceed to the "wait-for-click" process 702. The bounce identifier 532 may correctly identify, or classify, the edges that occur between the first-to-second-state edge 402 and the second-to-first-state edge 404 as bounce signals. The rest periods 810 and 812 may be at least substantially identical, or alternatively, may be adapted to match the differing time duration of switch bounce after a button click versus time duration of switch bounce after a button release. The rest periods 810 and 812 may also be adapted to match the user's preference, for example, the user may refer the rest period 812 to be shorter if he often double-clicks the button.

Figure 8B:
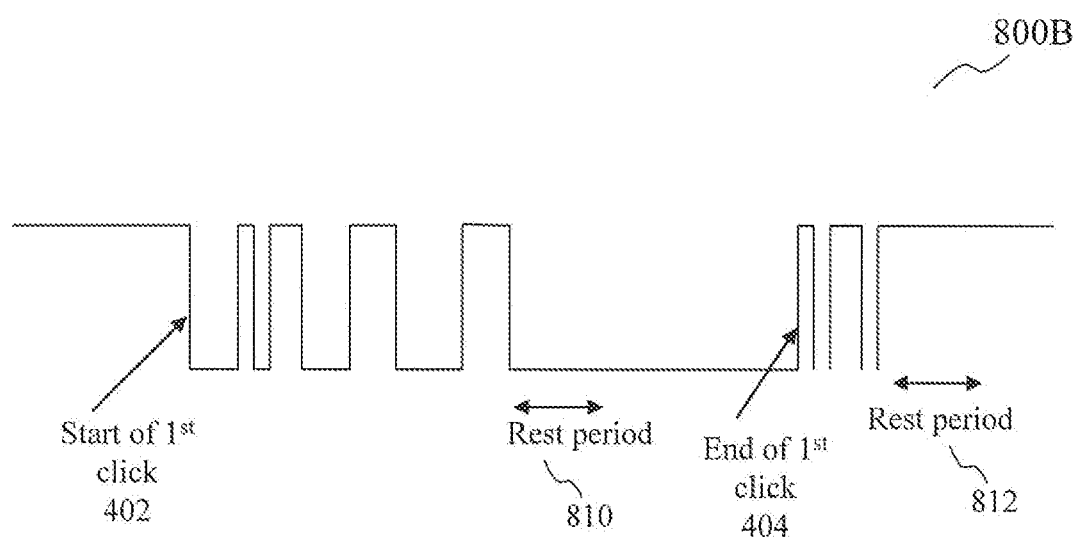
FIG. 8B shows a signal diagram illustrating a button click signal that includes persistent bounce signals, debounced using the method of FIG. 7.

FIG. 8B shows a signal diagram 800B illustrating a button click signal that includes persistent bounce signals, debounced using the method of FIG. 7. The button click signal includes bounce signals over a longer period of time as compared to FIG. 8A. By repeatedly resetting the timer 506 every time a new edge is detected prior to a complete count down to the rest period 810, the bounce signals may be accurately identified. The bounce signals may be identified because the control logic 506 identifies the bounce signals based on their time distance from an immediately preceding edge, instead of based on their time distance from the first-to-second-state edge 402 or the second-to-first-state edge 404. Therefore, the end of the button click event may be accurately identified, as the second-to-first-state edge 404 takes place after the timer 506 has completed the counting down to the rest period 810.

Figure 8C:
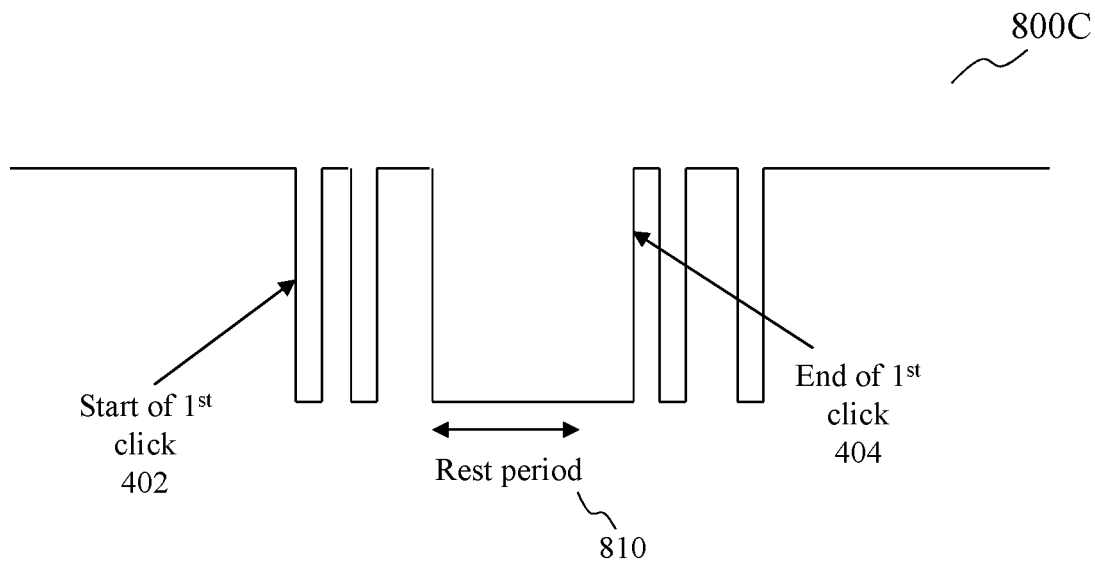
FIG. 8C shows a signal diagram illustrating a button click signal that has a short click interval, debounced using the method of FIG. 7.

FIG. 8C shows a signal diagram 800C illustrating a button click signal that has a short click interval, debounced using the method of FIG. 7. In this button click signal, the user released the button fairly quickly as compared to the button click signal of FIG. 8A. As the timer 506 measures the rest period 810 from every edge, instead of only from the first-to-second-state edge 402 like the masking period 410 of FIGS. 4A-4D, the rest period 810 may be set to a substantially shorter duration than the masking period 410. As a result, the substantially shorter rest period 810 may avoid erroneously masking out the second-to-first-state edge 404. Therefore, the transition identifier 530 may identify the second-to-first-state edge 404 as being indicative of a transition back to the idle state.

Figure 8D:
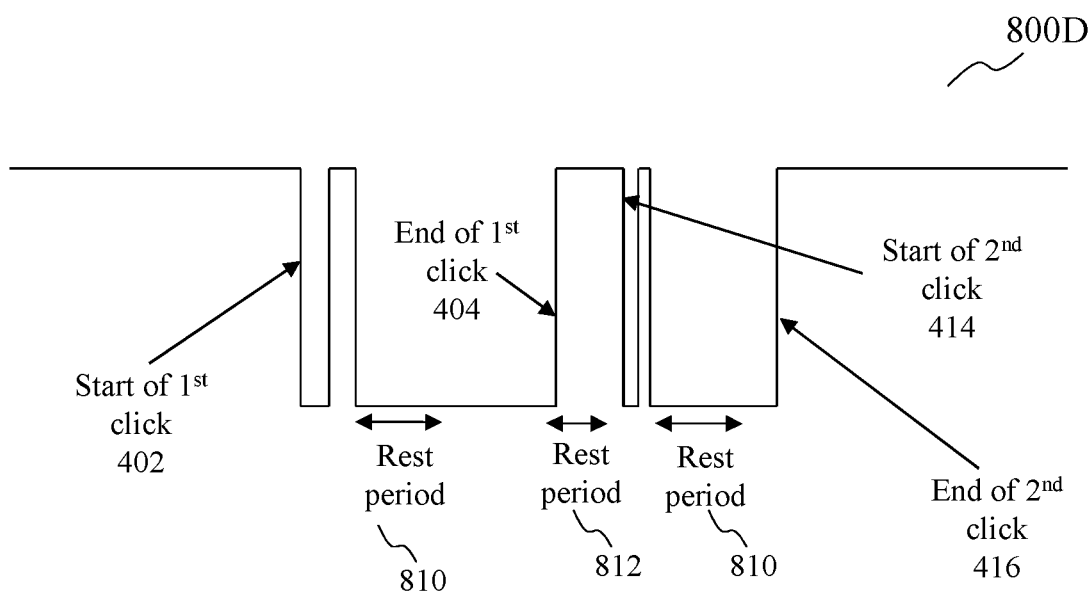
FIG. 8D shows a signal diagram illustrating a button click signal that includes a double-click, as debounced using the method of FIG. 7.

FIG. 8D shows a signal diagram 800D illustrating a button click signal that includes a double-click, as debounced using the method of FIG. 7. Similarly to FIG. 8C, as the rest period 810 is very short compared to conventional masking periods, and is measured from every preceding edge, the end of the first click as indicated by the second-to-first-state edge 404, may not be obscured. Therefore, the transition identifier 530 may identify the second-to-first-state edge 404 as being indicative of a transition back to the idle state. Even though the user clicks on the button again very shortly after the transition back to the idle state, the further first-to-second-state edge 414 indicative of the second click may be correctly detected and identified, as it occurs after the rest period 812 has lapsed.

While FIGS. 8A to 8D show the first-to-second-state edge 402 as a falling edge, and the second-to-first-state edge 404 as a rising edge, in other embodiments, the first-to-second-state edge 402 may be a rising edge, and the second-to-first-state edge 404 may be a falling edge.

Figure 9:
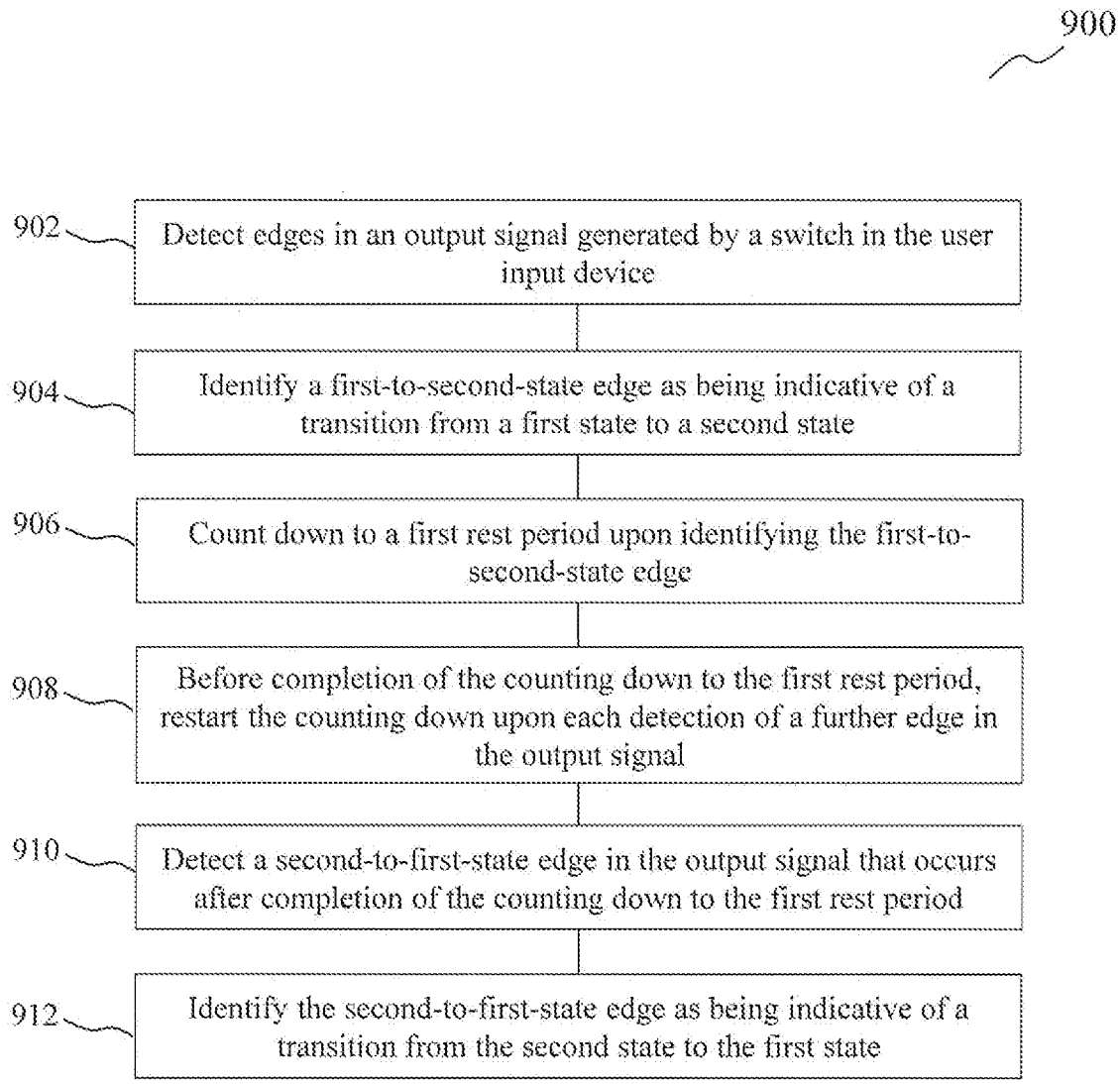
FIG. 9 shows a flow diagram of a method for identifying a user input in a user input device according to various embodiments.

FIG. 9 shows a flow diagram of a method 900 for identifying a user input in a user input device according to various embodiments. The method may include a plurality of processes 902, 904, 906, 908, 910 and 912. The process 902 may include detecting edges in an output signal generated by a switch in the user input device. The process 904 may include identifying a first-to-second-state edge as being indicative of a transition from a first state to a second state. The process 906 may include counting down to a first rest period upon identifying the first-to-second-state edge. The process 908 may include restarting the counting down upon each detection of a further edge in the output signal, before completion of the counting down to the first rest period. The process 910 may include detecting a second-to-first-state edge in the output signal that occurs after completion of the counting down to the first rest period. The process 912 may include identifying the second-to-first-state edge as being indicative of a transition from the second state to the first state.

In other words, according to various embodiments, the method may include the process 902 which may include sensing edges in a button click signal, also referred herein as output signal. The output signal may be generated by a switch coupled to a button of a user input device, when a user operates the button. The edges may be sharp changes in the value of the output signal, for example from high to low, or from low to high. The method may further include the process 904 which may include identifying a first-to-second-state edge as being indicative of a transition from a first state to a second state. The first-to-second-state edge may correspond to start of a button click event. The first state may be an idle state, while the second state may be an active state. The idle state may indicate that the switch is open. The active state may indicate that the switch is closed. The method may further include the process 906 which may include counting down to a first rest period upon identifying the first-to-second-state edge. The method may further include the process 908 which may include resetting the timer for restarting the counting down to the first rest period upon each detection of a further edge in the output signal before completion of the counting down to the first rest period. The method may further include the process 910 which may include detecting a second-to-first-state edge in the output signal that occurs after completion of the counting down to the first rest period. The second-to-first-state edge may be opposite in its direction of change in value, as compared to the first-to-second-state edge. The second-to-first-state edge may be the earliest edge that occurs in the output signal after completion of the counting down to the first rest period. The method may further include the process 912 which may include identifying the second-to-first-state edge as being indicative of a transition from the second state to the first state. The second-to-first-state edge may correspond to end of the button click event.

Figure 10:
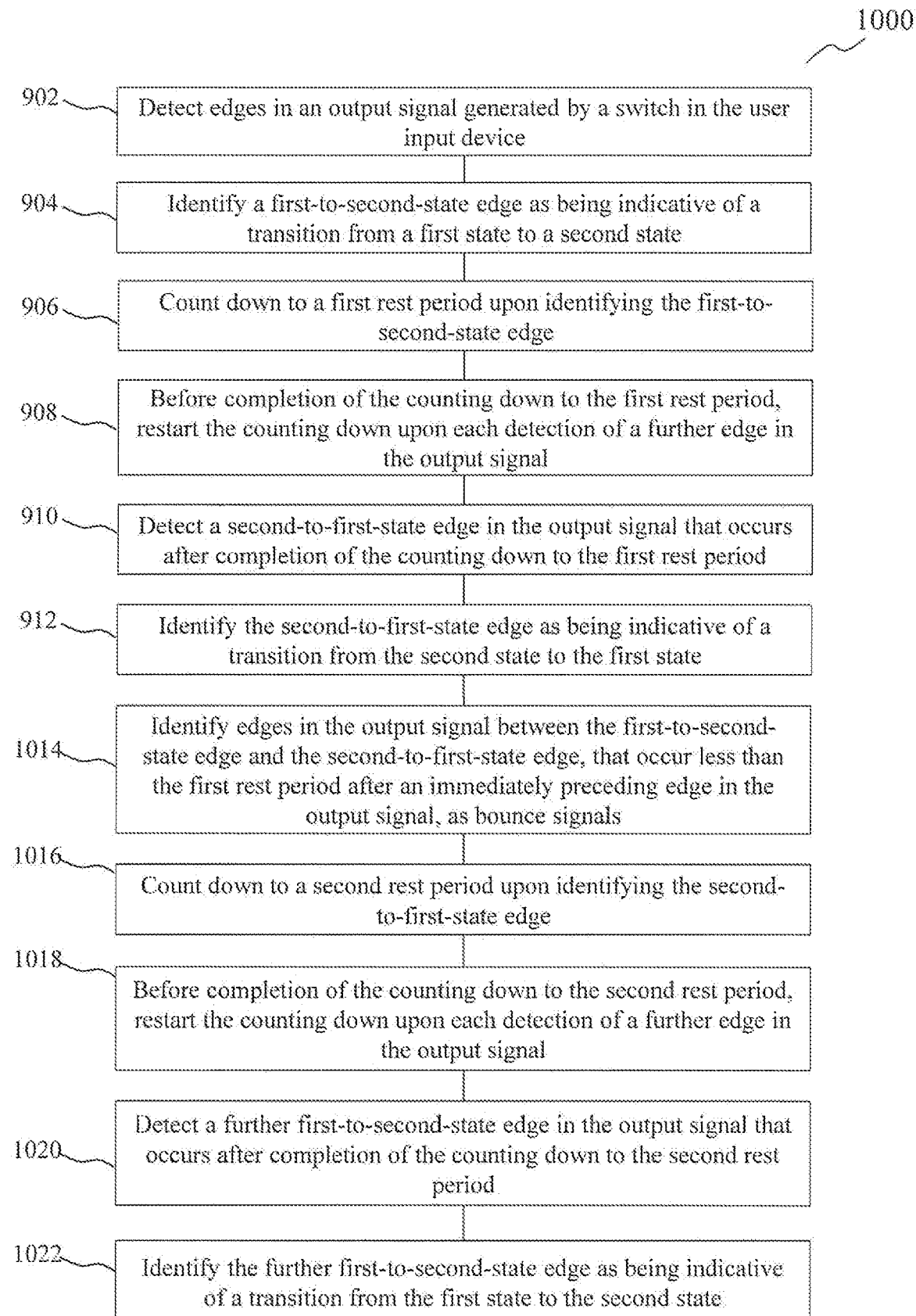
FIG. 10 shows a flow diagram of a method for identifying a user input in a user input device according to various embodiments.

FIG. 10 shows a flow diagram of a method 1000 for identifying a user input in a user input device according to various embodiments. The method 1000 may include the method 900, in that it may include processes 902, 904, 906, 908, 910 and 912. In addition, the method 1000 may further include processes 1014, 1016, 1018, 1020 and 1022. The process 1014 may include identifying edges in the output signal between the first-to-second-state edge and the second-to-first-state edge, that occur less than the first rest period after an immediately preceding edge in the output signal, as bounce signals. The method may further include ignoring the identified bounce signals. The method may further include recording intervals between successive identified bounce signals, and adjusting the first rest period based on a longest interval of the recorded intervals. The process 1016 may include counting down to a second rest period upon identifying the second-to-first-state edge. The process 1018 may include restarting the counting down upon each detection of a further edge in the output signal, before completion of the counting down to the second rest period. The process 1020 may include detecting a further first-to-second-state edge in the output signal that occurs after completion of the counting down to the second rest period. The process 1022 may include identifying the further first-to-second-state edge as being indicative of a transition from the first state to the second state. The method may further include identifying edges between the second-to-first-state edge and the further first-to-second-state edge in the output signal, that occur less than the second rest period after an immediately preceding edge in the output signal, as further bounce signals. The method may further include ignoring the identified further bounce signals. The method may further include recording further intervals between successive identified further bounce signals and adjusting the second rest period based on a longest interval of the recorded further intervals.

Figure 11:
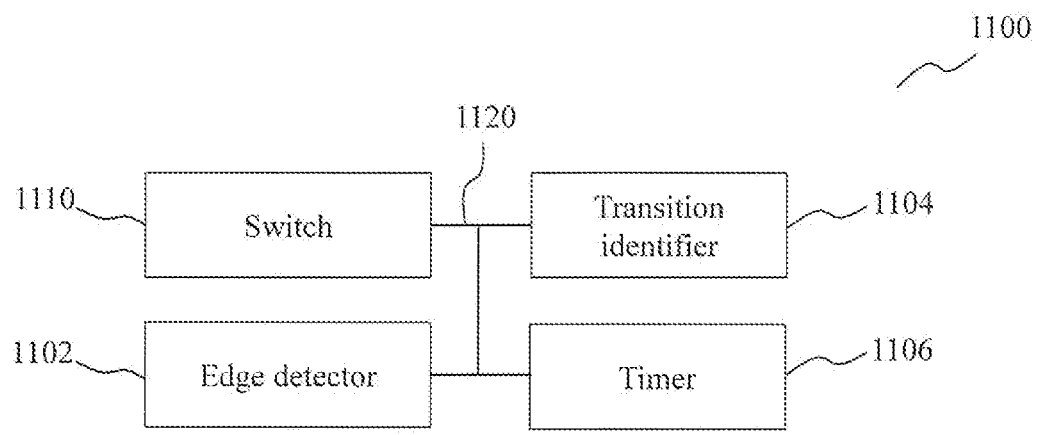
FIG. 11 shows a conceptual diagram of a user input device according to various embodiments.

FIG. 11 shows a conceptual diagram of a user input device 1100 according to various embodiments. The user input device 1100 may include, or may be part of, the user input device 500. The user input device 1100 may include a switch 1110, an edge detector 1102, a transition identifier 1104, and a timer 1106. The user input device 1100 may also include a button clickable to operate the switch 1110. The switch 1110 may be configured to generate an output signal upon being operated. The switch 1110 may include, or may be part of the switch 510. The edge detector 1102 may be configured to detect edges in the output signal. The edge detector 1102 may include, or may be part of the edge sensing logic 502. The transition identifier 1104 may be configured to identify a first-to-second-state edge as being indicative of a transition from a first state to a second state. The first state may be an idle state indicating that the button is released, while the second state may be an active state indicating that the button is pressed or depressed. The first-to-second-state edge may correspond to clicking of the button. The transition identifier 1104 may include, or may be part of the transition identifier 530. The timer 1106 may be configured to count down to a first rest period upon the transition identifier 1104 identifying the first-to-second-state edge, and further configured to restart the counting down every time the edge detector detects a further edge in the output signal before the timer completes the counting down to the first rest period. The timer 1106 may include, or may be part of the timer 506. The transition identifier 1104 may be further configured to identify a second-to-first-state edge in the output signal that occurs after completion of the counting down to the first rest period, as being indicative of a transition from the second state to the first state. The second-to-first-state edge may be the earliest edge that occurs in the output signal after completion of the counting down to the first rest period. The second-to-first-state edge may correspond to releasing of the button. The switch 1110, the edge detector 1102, the transition identifier 1104, and the timer 1106 may be coupled with each other, like indicated by lines 1120, for example electrically coupled, for example using a line or a cable, and/or mechanically coupled.

According to various embodiments, the user input device may be one of a keyboard or a computer mouse.

According to various embodiments, the user input device may include a user interface for the user to customize the first rest period and the second rest period. Each of the first rest period and the second rest period may be programmable by the user.

According to various embodiments, the user input device 1100 may further include a bounce identifier configured to identify edges in the output signal between the first-to-second-state edge and the second-to-first-state edge, that occur less than the first rest period after an immediately preceding edge in the output signal, as bounce signals. The bounce identifier may include, or may be part of the bounce identifier 532. The user input device 1100 may also include a recorder configured to record intervals between successive identified bounce signals. The recorder may include, or may be part of the recorder 524. The user input device 1100 may also include a rest period adjuster configured to adjust the first rest period based on a longest interval of the recorded intervals. The rest period adjuster may include, or may be part of the rest period adjuster 526.

Figure 12:
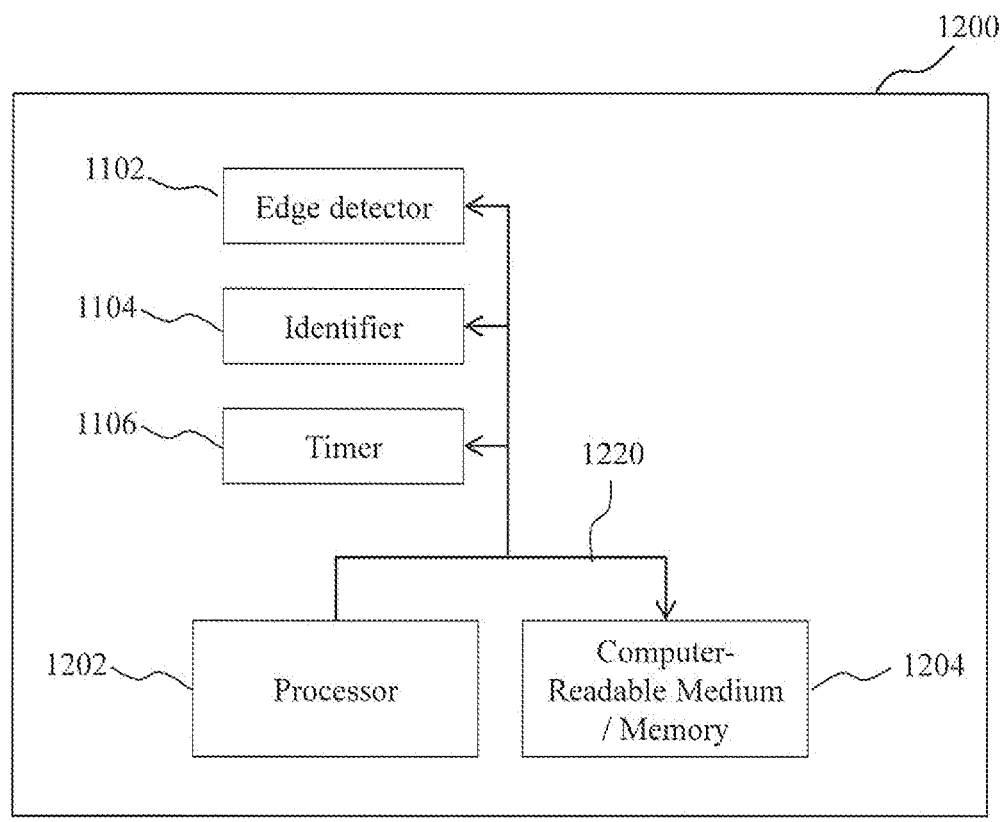
FIG. 12 is a diagram illustrating an example of a hardware implementation for a user input detector employing a processing system.

FIG. 12 is a diagram 1200 illustrating an example of a hardware implementation for a user input detector employing a processing system. The processing system may be implemented with a bus architecture, represented generally by the bus 1220. The bus 1220 may include any number of interconnecting buses and bridges depending on the specific application of the processing system and the overall design constraints. The bus 1220 may link together various circuits including one or more processors and/or hardware components, represented by the processor 1202, the components 1102, 1104, 1106, and the computer-readable medium/memory 1204. The bus 1220 may also link various other circuits such as timing sources, peripherals, voltage regulators, and power management circuits, which are well known in the art, and therefore, will not be described any further.

The processing system may include a processor 1202 coupled to a computer-readable medium/memory 1204. The processor 1202 may be responsible for general processing, including the execution of software stored on the computer-readable medium/memory 1204. The software, when executed by the processor 1202, may cause the processing system to perform the various functions described supra for any particular apparatus. The computer-readable medium/memory 1204 may also be used for storing data that is manipulated by the processor 1202 when executing software. The processing system may further include at least one of the components 1102, 1104, 1106. The components may be software components running in the processor 1202, resident/stored in the computer readable medium/memory 1204, one or more hardware components coupled to the processor 1202, or some combination thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

It will be understood that in the description above, whenever reference is made to a "module", both the respective steps in a method, in which the functionality of the "module" is carried out, and the respective circuit configured to carry out the functionality of the "module" is addressed.

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

The following examples pertain to further embodiments.

Example 1 is a method for identifying a user input in a user input device, the method including: detecting edges in an output signal generated by a switch in the user input device; identifying a first-to-second-state edge as being indicative of a transition from a first state to a second state; counting down to a first rest period upon identifying the first-to-second-state edge; before completion of the counting down to the first rest period, restarting the counting down upon each detection of a further edge in the output signal; detecting a second-to-first-state edge in the output signal that occurs after completion of the counting down to the first rest period; and identifying the second-to-first-state edge as being indicative of a transition from the second state to the first state.

In example 2, the subject-matter of example 1 can optionally include that the first-to-second-state edge is a falling edge and the second-to-first-state edge is a rising edge.

In example 3, the subject-matter of example 1 or example 2 can optionally include: identifying edges in the output signal between the first-to-second-state edge and the second-to-first-state edge, that occur less than the first rest period after an immediately preceding edge in the output signal, as bounce signals.

In example 4, the subject-matter of example 3 can optionally include: ignoring the identified bounce signals.

In example 5, the subject-matter of example 3 or example 4 can optionally include: recording intervals between successive identified bounce signals; and adjusting the first rest period based on a longest interval of the recorded intervals.

In example 6, the subject-matter of any one of examples 1 to 5 can optionally include: counting down to a second rest period upon identifying the second-to-first-state edge; before completion of the counting down to the second rest period, restarting the counting down upon each detection of a further edge in the output signal; detecting a further first-to-second-state edge in the output signal that occurs after completion of the counting down to the second rest period; and identifying the further first-to-second-state edge as being indicative of a transition from the first state to the second state.

In example 7, the subject-matter of example 6 can optionally include: identifying edges between the second-to-first-state edge and the further first-to-second-state edge in the output signal, that occur less than the second rest period after an immediately preceding edge in the output signal, as further bounce signals.

In example 8, the subject-matter of example 7 can optionally include: ignoring the identified further bounce signals.

In example 9, the subject-matter of example 7 or example 8 can optionally include: recording further intervals between successive identified further bounce signals; and adjusting the second rest period based on a longest interval of the recorded further intervals.

In example 10, the subject-matter of any one of examples 1 to 9 can optionally include that the first state is an idle state indicating that the switch is open and wherein the second state is an active state indicating that the switch is closed.

In example 11, the subject-matter of any one of examples 1 to 10 can optionally include that the first-to-second-state edge corresponds to start of a button click event, and wherein the second-to-first-state edge corresponds to end of the button click event.

Example 12 is a user input device including: a switch configured to generate an output signal upon being operated; an edge detector configured to detect edges in the output signal; a transition identifier configured to identify a first-to-second-state edge as being indicative of a transition from a first state to a second state; a timer configured to count down to a first rest period upon the transition identifier identifying the first-to-second-state edge, and further configured to restart the counting down every time the edge detector detects a further edge in the output signal before the timer completes the counting down to the first rest period; wherein the transition identifier is further configured to identify a second-to-first-state edge in the output signal that occurs after completion of the counting down to the first rest period, as being indicative of a transition from the second state to the first state.

In example 13, the subject-matter of example 12 can optionally include: a button clickable to operate the switch.

In example 14, the subject-matter of example 13 can optionally include that the first state is an idle state indicating that the button is released, and wherein the second state is an active state indicating that the button is depressed.

In example 15, the subject-matter of example 13 or example 14 can optionally include that the first-to-second-state edge corresponds to clicking of the button, wherein the second-to-first-state edge corresponds to releasing of the button.

In example 16, the subject-matter of any one of examples 12 to 15 can optionally include that the user input device is one of a computer mouse or a keyboard.

In example 17, the subject-matter of any one of examples 12 to 16 can optionally include that each of the first rest period and the second rest period is programmable by a user of the user input device.

In example 18, the subject-matter of any one of examples 12 to 17 can optionally include: a bounce identifier configured to identify edges in the output signal between the first-to-second-state edge and the second-to-first-state edge, that occur less than the first rest period after an immediately preceding edge in the output signal, as bounce signals.

In example 19, the subject-matter of example 18 can optionally include: a recorder configured to record intervals between successive identified bounce signals; and a rest period adjuster configured to adjust the first rest period based on a longest interval of the recorded intervals.

Example 20 is a non-transitory computer-readable medium including instructions which, when executed by a processor, causes the processor to perform a method for identifying a user input in a user input device, the method including: detecting edges in an output signal generated by a switch in the user input device; identifying a first-to-second-state edge as being indicative of a transition from a first state to a second state; counting down to a first rest period upon identifying the first-to-second-state edge; before completion of the counting down to the first rest period, restarting the counting down upon each detection of a further edge in the output signal; detecting a second-to-first-state edge in the output signal that occurs after completion of the counting down to the first rest period; and identifying the second-to-first-state edge as being indicative of a transition from the second state to the first state.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

The invention claimed is:

1. A method for identifying a user input in a user input device, the method including:
   detecting edges in an output signal generated by a switch in the user input device;
   identifying a first-to-second-state edge as being indicative of a transition from a first state to a second state;
   counting down to a first rest period upon identifying the first-to-second-state edge;
   before completion of the counting down to the first rest period, restarting the counting down upon each detection of a further edge in the output signal;
   detecting a second-to-first-state edge in the output signal that occurs after completion of the counting down to the first rest period;
   identifying the second-to-first-state edge as being indicative of a transition from the second state to the first state;
   identifying edges in the output signal between the first-to-second-state edge and the second-to-first-state edge, that occur less than the first rest period after an immediately preceding edge in the output signal, as bounce signals;
   recording intervals between successive identified bounce signals; and
   adjusting the first rest period based on a longest interval of the recorded intervals.

2. The method of claim 1, wherein the first-to-second-state edge is a falling edge and the second-to-first-state edge is a rising edge.

3. The method of claim 1, further including:
   ignoring the identified bounce signals.

4. The method of claim 1, further including:
   counting down to a second rest period upon identifying the second-to-first-state edge;
   before completion of the counting down to the second rest period, restarting the counting down upon each detection of a further edge in the output signal;
   detecting a further first-to-second-state edge in the output signal that occurs after completion of the counting down to the second rest period; and
   identifying the further first-to-second-state edge as being indicative of a transition from the first state to the second state.

5. The method of claim 4, further including:
   identifying edges between the second-to-first-state edge and the further first-to-second-state edge in the output signal, that occur less than the second rest period after an immediately preceding edge in the output signal, as further bounce signals.

6. The method of claim 5, further including:
   ignoring the identified further bounce signals.

7. The method of claim 5, further including:
   recording further intervals between successive identified further bounce signals; and
   adjusting the second rest period based on a longest interval of the recorded further intervals.

8. The method of claim 1, wherein the first state is an idle state indicating that the switch is open and wherein the second state is an active state indicating that the switch is closed.

9. The method of claim 1, wherein the first-to-second-state edge corresponds to start of a button click event, and wherein the second-to-first-state edge corresponds to end of the button click event.

10. A user input device including:
- a switch configured to generate an output signal upon being operated;
- an edge detector configured to detect edges in the output signal;
- a transition identifier configured to identify a first-to-second-state edge as being indicative of a transition from a first state to a second state;
- a timer configured to count down to a first rest period upon the transition identifier identifying the first-to-second-state edge, and further configured to restart the counting down every time the edge detector detects a further edge in the output signal before the timer completes the counting down to the first rest period;
- wherein the transition identifier is further configured to identify a second-to-first-state edge in the output signal that occurs after completion of the counting down to the first rest period, as being indicative of a transition from the second state to the first state;
- a bounce identifier configured to identify edges in the output signal between the first-to-second-state edge and the second-to-first-state edge, that occur less than the first rest period after an immediately preceding edge in the output signal, as bounce signals;
- a recorder configured to record intervals between successive identified bounce signals; and
- a rest period adjuster configured to adjust the first rest period based on a longest interval of the recorded intervals.

11. The user input device of claim 10, further including a button clickable to operate the switch.

12. The user input device of claim 11, wherein the first state is an idle state indicating that the button is released, and wherein the second state is an active state indicating that the button is depressed.

13. The user input device of claim 11, wherein the first-to-second-state edge corresponds to clicking of the button, wherein the second-to-first-state edge corresponds to releasing of the button.

14. The user input device of claim 10, wherein the user input device is one of a computer mouse or a keyboard.

15. The user input device of claim 10, wherein each of the first rest period and the second rest period is programmable by a user of the user input device.

16. A non-transitory computer-readable medium including instructions which, when executed by a processor, causes the processor to perform a method for identifying a user input in a user input device, the method including:
- detecting edges in an output signal generated by a switch in the user input device;
- identifying a first-to-second-state edge as being indicative of a transition from a first state to a second state;
- counting down to a first rest period upon identifying the first-to-second-state edge;
- before completion of the counting down to the first rest period, restarting the counting down upon each detection of a further edge in the output signal;
- detecting a second-to-first-state edge in the output signal that occurs after completion of the counting down to the first rest period; and
- identifying the second-to-first-state edge as being indicative of a transition from the second state to the first state identifying edges in the output signal between the first-to-second-state edge and the second-to-first-state edge, that occur less than the first rest period after an immediately preceding edge in the output signal, as bounce signals;
- recording intervals between successive identified bounce signals; and
- adjusting the first rest period based on a longest interval of the recorded intervals.

* * * * *